United States Patent
Kim

(10) Patent No.: US 11,774,294 B2
(45) Date of Patent: Oct. 3, 2023

(54) AMPLIFIER CAPABLE OF CANCELLING OFFSET AND SENSOR CAPABLE OF CANCELLING OFFSET COMPONENT

(71) Applicant: Gwanak Analog CO., LTD., Seoul (KR)

(72) Inventor: Suhwan Kim, Seoul (KR)

(73) Assignee: Gwanak Analog CO., LTD., Seoul (KR)

( * ) Notice: Subject to any disclaimer, the term of this patent is extended or adjusted under 35 U.S.C. 154(b) by 509 days.

(21) Appl. No.: 17/063,304

(22) Filed: Oct. 5, 2020

(65) Prior Publication Data

US 2021/0018373 A1 Jan. 21, 2021

Related U.S. Application Data

(63) Continuation of application No. PCT/KR2019/004435, filed on Apr. 12, 2019.

(30) Foreign Application Priority Data

Apr. 14, 2018 (KR) .................. 10-2018-0043649

(51) Int. Cl.
*G01K 3/00* (2006.01)
*H03F 3/16* (2006.01)
(Continued)

(52) U.S. Cl.
CPC ............... *G01K 3/005* (2013.01); *H03F 3/16* (2013.01); *H03F 3/45475* (2013.01);
(Continued)

(58) Field of Classification Search
CPC ...... G01K 3/005; G01K 2219/00; H03F 3/16; H03F 3/45475; H03F 3/45744;
(Continued)

(56) References Cited

U.S. PATENT DOCUMENTS 5,591,895 A * 1/1997 Rigby .................. G01F 1/64
73/28.01
6,909,391 B2 * 6/2005 Rossi ................... H03F 3/005
341/172
(Continued)

FOREIGN PATENT DOCUMENTS

JP 2009284150 A 12/2009
KR 1020170036719 A 4/2017
(Continued)

OTHER PUBLICATIONS

Application note of Sharp dust sensor, GP2Y1010AU0F, Sheet No. OP13024EN, pp. 1-6, Dec. 1, 2006, SHARP.
(Continued)

*Primary Examiner* — Nathaniel T Woodward
*Assistant Examiner* — Philip L Cotey
(74) *Attorney, Agent, or Firm* — William Park & Associates Ltd.

(57) ABSTRACT

An amplifier includes an amplification circuit including an input circuit receiving an input signal and configured to output an output signal by amplifying the input signal; and an offset cancelling circuit configured to cancel offset by controlling the input circuit according to activation control signal and offset control signal, wherein the offset cancelling circuit cancels the offset according to the offset control signal after the activation control signal is activated.

18 Claims, 5 Drawing Sheets

(51) Int. Cl.
  *H03F 3/45* (2006.01)
  *H03F 3/08* (2006.01)
  *G01N 15/02* (2006.01)
  *H03F 3/00* (2006.01)

(52) U.S. Cl.
  CPC ..... *H03F 3/45744* (2013.01); *G01K 2219/00* (2013.01); *G01N 15/02* (2013.01); *G01N 15/0205* (2013.01); *H03F 3/005* (2013.01); *H03F 3/087* (2013.01); *H03F 3/45968* (2013.01); *H03F 2200/375* (2013.01)

(58) Field of Classification Search
  CPC ...... H03F 3/005; H03F 3/087; H03F 3/45968; H03F 2200/375; G01N 15/02; G01N 15/0205
  See application file for complete search history.

(56) References Cited

U.S. PATENT DOCUMENTS

| | | | | |
|---|---|---|---|---|
| 7,436,251 | B2* | 10/2008 | Ozgun | H03H 11/04 |
| | | | | 700/286 |
| 8,440,957 | B2* | 5/2013 | Dierickx | G01T 1/247 |
| | | | | 250/214 R |
| 8,659,339 | B2* | 2/2014 | Jung | H04N 25/616 |
| | | | | 348/241 |
| 9,521,342 | B2* | 12/2016 | Mesgarani | H04N 25/75 |
| 2010/0254711 | A1* | 10/2010 | Miller | H04B 10/6932 |
| | | | | 398/136 |
| 2012/0133800 | A1* | 5/2012 | Jung | H04N 25/616 |
| | | | | 341/172 |
| 2014/0185835 | A1* | 7/2014 | Fraisse | H03F 3/2175 |
| | | | | 381/119 |
| 2016/0285563 | A1* | 9/2016 | Tanaka | H03F 3/45475 |
| 2017/0322133 | A1* | 11/2017 | Trainer | G01N 21/474 |
| 2018/0109326 | A1* | 4/2018 | Tanaka | G01J 1/44 |
| 2018/0131342 | A1* | 5/2018 | Zamprogno | H03F 3/45973 |

FOREIGN PATENT DOCUMENTS

| | | |
|---|---|---|
| KR | 1020170066044 A | 6/2017 |
| KR | 1020170071808 A | 6/2017 |
| KR | 101757079 B1 | 7/2017 |

OTHER PUBLICATIONS

Carolyn Mathas, Some Work-a-Day Sensors Get Their Due, https://www.digikey.kr/ko/articles/some-work-a-day-sensors-get-their-due, pp. 1-5, Jul. 10, 2014, DigiKey, Electronic Products.

Cheng-Ta Chiang et al., "A CMOS particulate matter 2.5 (PM2.5) concentration to frequency converter with calibration circuits for air quality monitoring applications", Mechatronics and Automation (ICMA) 2016 IEEE International Conference, pp. 966-970, 2016, ISSN 2152-744X, Harbin, China.

Compact Optical Dust Sensor, GP2Y1010AU0F, Sheet No. E4-A01501EN, pp. 1-9, Dec. 1, 2006, SHARP Corporation.

Jimin Cheon et al., "A Single-Chip CMOS Smoke and Temperature Sensor for an Intelligent Fire Detector", Aug. 2009, pp. 914-921, vol. 9, No. 8, IEEE Sensors Journal, ISSN 1530-437X.

Lee Hartley et al., "Hybrid Integration of an Active Pixel Sensor and Microfluidics for Cytometry on a Chip," IEEE Transactions on Circuits and Systems—I: Regular Papers, vol. 54, No. 1, Jan. 2007, pp. 99-110.

Pietro Ciccarella et al., "28.7 CMOS monolithic airborne-particulate-matter detector based on 32 capacitive sensors with a resolution of 65zF rms", Solid-State Circuits Conference (ISSCC) 2016 IEEE International, pp. 486-488, 2016, ISSN 2376-8606, Politecnico di Milano, Milano, Italy.

Woo-Yeol Shin, "An Impedance-Matched Bidirectional Multi-Drop Memory Interface," Ph. D. Dissertation, Feb. 2013, pp. 1-120, Seoul National University.

* cited by examiner

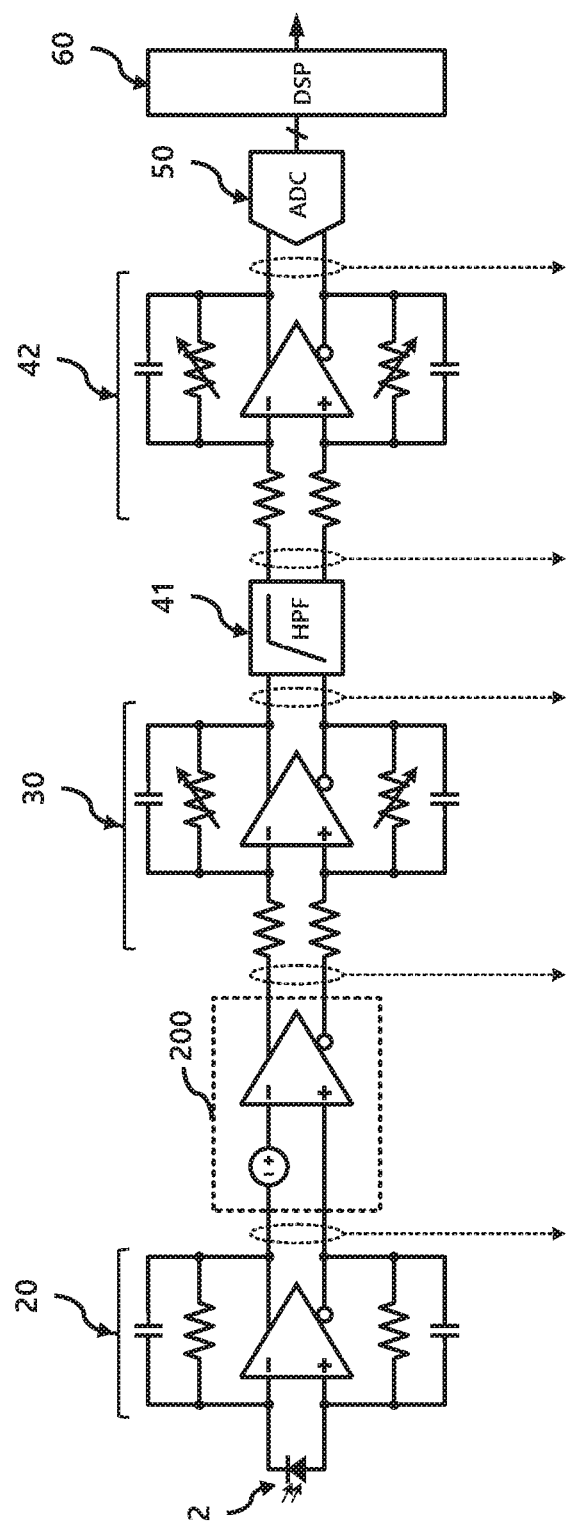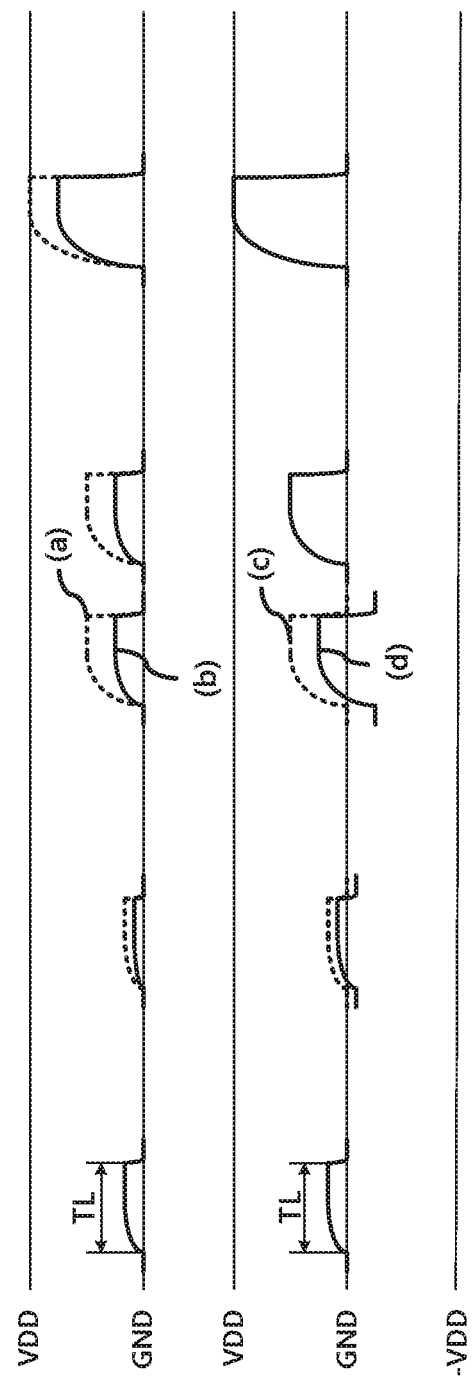
FIG. 3A
FIG. 3B
FIG. 3C

AMPLIFIER CAPABLE OF CANCELLING OFFSET AND SENSOR CAPABLE OF CANCELLING OFFSET COMPONENT

CROSS-REFERENCE TO RELATED APPLICATIONS

This application is a continuation of and claims priority to PCT application No. PCT/KR2019/004435, filed on Apr. 12, 2019, which claims priority to Korean Patent Application No. 10-2018-0043649, filed on Apr. 14, 2018, which is incorporated herein by reference in its entirety.

BACKGROUND

1. Technical Field

Various embodiments generally relate to an amplifier capable of cancelling offset and a sensor capable of cancelling offset component.

2. Related Art

A conventional particle sensor use a light source such as an infrared LED to illuminate sensing area or medium.

A particle sensor using a laser diode as a light source may filter out particles of a certain size or more through a filter.

After that, an optical receiver detects degree of light scattering and attenuation, and outputs it as an electric signal.

In such a conventional particle sensor, relatively large offset component is added by a light source or the like, but it is necessary to remove the offset component from the sensor for accurate detection.

A correlated double sampling (CDS) technique may be used for removing the offset component.

This method can only be used in an analog circuit using a switched capacitor method, but the circuit for using the switched capacitor method has a drawback of large area and power consumption.

A digital-to-analog converter (DAC) may be used for removing the offset component, where the DAC converts a digital value corresponding to an offset signal into an analog signal, subtracts it from an input signal, and performs analog signal processing.

This method should consider noise component of the DAC itself, and requires a large area and power consumption due to the DAC.

SUMMARY

In accordance with the present teachings, an amplifier may include an amplification circuit including an input circuit receiving an input signal and configured to output an output signal by amplifying the input signal; and an offset cancelling circuit configured to cancel offset by controlling the input circuit according to activation control signal and offset control signal, wherein the offset cancelling circuit cancels the offset according to the offset control signal after the activation control signal is activated.

In accordance with the present teachings, an amplifier may include an amplification circuit including an input circuit receiving a first input signal and a second input signal and configured to output differential output signals by amplifying difference between the first input signal and the second input signal; and a first offset cancelling circuit configured to cancel offset by controlling the input circuit according to activation control signal and a first offset control signal, wherein the first offset cancelling circuit cancels the offset according to the first offset control signal after the activation control signal is activated.

In accordance with the present teachings, a sensor may include a signal output circuit configured to output a source signal into a medium; a signal receiving circuit configured to receive the source signal passing through the medium; an offset cancelling circuit configured to cancel offset from an output of the signal receiving circuit; an analog-to-digital converter (ADC) configured to convert a signal output from the offset cancelling circuit into a digital signal; and a control signal configured to generate the offset control signal by controlling the signal receiving circuit and the offset cancelling circuit, wherein the control circuit controls activation of the signal output circuit by a first activation control signal and controls activation of the offset cancelling circuit by a second activation control signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIG. 3A shows a block diagram of a sensor according to an embodiment of the present disclosure and FIGS. 3B and 3C show waveforms of signals illustrating operations of the sensor according to an embodiment of the present disclosure.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
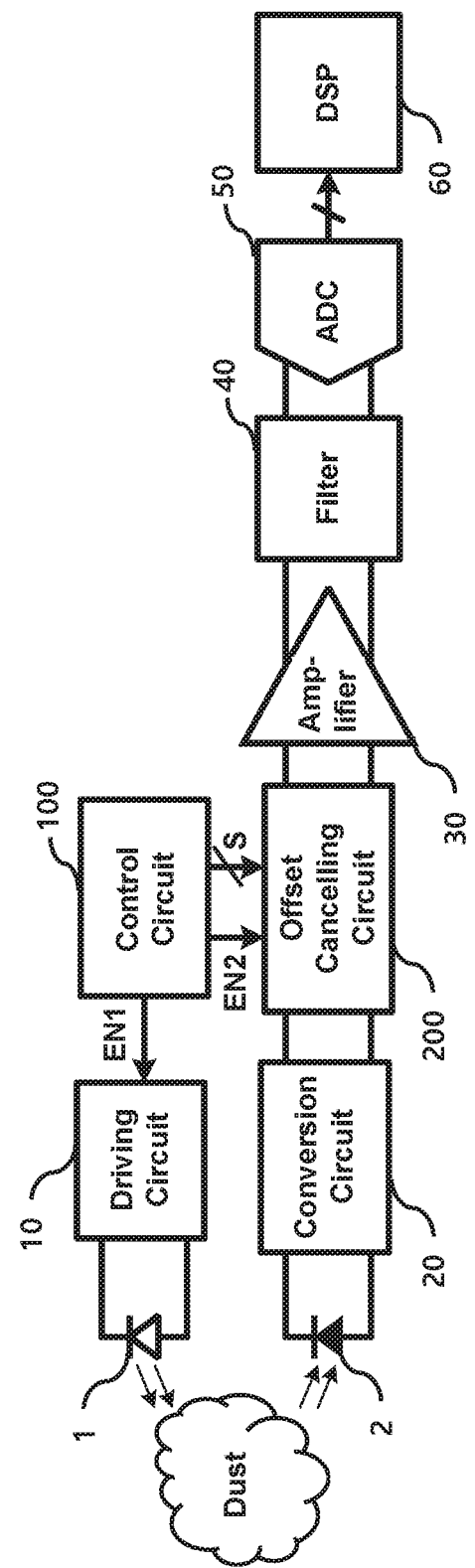
FIG. 1 shows a block diagram of a sensor according to an embodiment of the present disclosure.

FIG. 1 is a block diagram showing a sensor according to an embodiment of the present disclosure.

The sensor according to an embodiment of the present disclosure includes a light source 1, a driving circuit 10 for driving the light source 1, an optical receiver 2, and a conversion circuit 20 for converting an output signal of the optical receiver 2.

The light source 1 and the driving circuit 10 may be referred as a signal output circuit and the optical receiver 2 and the conversion circuit 20 may be referred as a signal receiving circuit.

The light source 1 may be implemented using various light emitting devices such as infrared LEDs and laser diodes. The light source 1 illuminates dust in a sensing area or a medium. Light emitted from the light source 1 may be referred as a source signal.

According to an embodiment, the driving circuit 10 may be included in the light source 1.

The optical receiver 2 converts intensity of light passing through the medium into a current signal, and the conversion circuit 20 converts the current signal output from the optical receiver 2 into a voltage signal.

Depending on the embodiment, the conversion circuit 20 may be included in the optical receiver 2.

Depending on embodiments, the optical receiver 2 may output a voltage signal corresponding to the intensity of light, and the conversion circuit 20 may be selectively included in the optical receiver 2 to amplify the voltage signal.

The sensor according to an embodiment of the present disclosure includes an offset cancelling circuit 200 that removes offset component from a signal output from the conversion circuit 20, and a control circuit 100 that controls the driving circuit 10 and the offset cancelling circuit 200. The offset component may be referred as offset.

The sensor includes an amplifier 30 that amplifies output of the offset cancelling circuit 200, a filter 40 that filters output of the amplifier 30, and an analog-to-digital converter (ADC) 50 that converts output of the filter 40 into a digital signal, and a digital signal processor (DSP) 60 that processes the digital signal.

In this embodiment, the amplifier 30 is an amplifier capable of adjusting a gain and may include multiple stages.

In this embodiment, the filter 40 is a band-pass filter and may be configured by a combination of a high pass filter and a low pass filter.

Method for coupling the amplifier 30 and the filter 40 may be variously changed. For example, the filter 40 may be coupled to the offset cancelling circuit 200 and the amplifier 30 may be coupled between the filter 40 and the ADC 50 in an embodiment.

In other embodiments, the amplifier 30 may include a plurality of sub-amplifiers and the filter 40 may include a plurality of sub-filters, where the plurality of sub-amplifier and the plurality of sub-filters may be coupled variously by a person skilled in the art.

In this embodiment, the control circuit 100 determines the offset control signal S and controls the offset cancelling circuit 200 according to the offset control signal S.

Also, the control circuit 100 controls activation time of the driving circuit 10 and activation time of the offset cancelling circuit 200.

More specifically, in this embodiment, the offset cancelling circuit 200 is not always activated, but is controlled to be activated for a certain time.

The configuration of the control circuit 100 will be described with reference to FIG. 2.

Figure 2A:
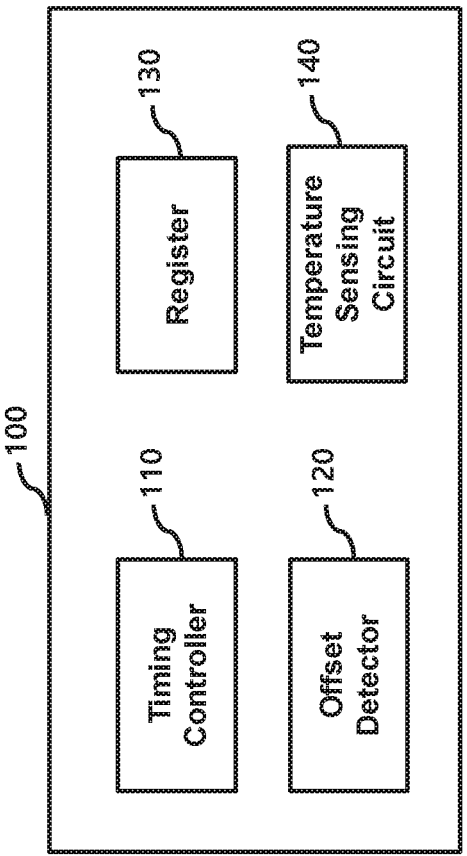
FIG. 2A shows a block diagram of a control circuit according to an embodiment of the present disclosure and FIG. 2B shows a timing diagram illustrating an operation of the control circuit according to an embodiment of the present disclosure.
Figure 2B:
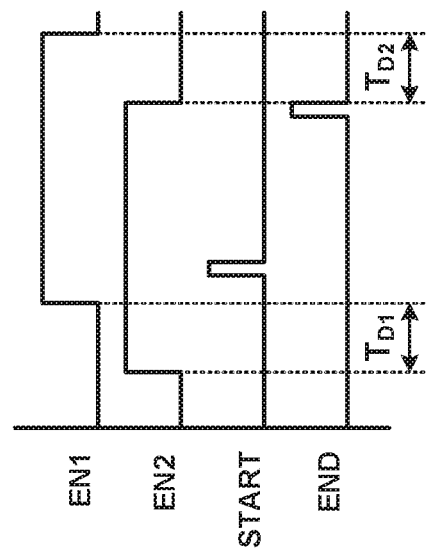

FIG. 2A is a block diagram of the control circuit 100 and FIG. 2B is a timing diagram showing an operation of the control circuit 100.

FIG. 2A shows a detailed block diagram of the control circuit 100.

The control circuit 100 includes a timing controller 110, an offset detector 120 and a register 130.

The control circuit 100 may further include a temperature sensing circuit 140.

The timing controller 110 controls activation of the driving circuit 10 and the offset cancelling circuit 200 by using the first activation control signal EN1 and the second activation control signal EN2.

In this embodiment, the light source 1 may be activated together with the driving circuit 10, and the optical receiver 2 may be activated together with the conversion circuit 20.

The offset detector 120 determines the offset control signal S according to the offset added to the input signal.

In this embodiment, the offset control signal S is a multi-bit digital signal.

The offset control signal S may include a first offset control signal S1 and a second offset control signal S2 that are independent of each other.

In this embodiment, the first offset control signal S1 and the second offset control signal S2 are multi-bit digital signals, respectively.

The register 130 stores the offset control signal S determined by the offset detector 120 so that it may be reused.

FIG. 2B is a timing diagram showing the operation of the timing controller 110.

In this embodiment, the second activation control signal EN2 is activated earlier than the first activation control signal EN1 by a first interval TD1.

In the present embodiment, while the light source 1 is turned off, that is, while the first activation control signal EN1 is deactivated, the offset cancelling circuit 200 may be turned off to reduce power consumption.

At this time, one or more elements among the optical receiver 2, the conversion circuit 20, the amplifier 30, the filter 40, and the ADC 50 may be deactivated together with the offset cancelling circuit 200.

In this embodiment, the optical receiver 2, the conversion circuit 200, and the offset cancelling circuit 200 are activated and initialized according to the second activation control signal EN2 before activating the driving circuit 10 by the first interval TD1.

At this time, the optical receiver 2, the conversion circuit 20, the amplifier 30, the filter 40, and the ADC 50 may be activated together with the offset cancelling circuit 200.

Initialization operation may include an operation such as setting a bias voltage and charging or discharging a capacitor in the filter 40.

When the time required for the initialization operation is very short, the first interval TD1 may converge to 0, and the first activation control signal EN1 and the second activation control signal EN2 may be activated at substantially the same time.

In this embodiment, the first activation control signal EN1 may be deactivated after the second interval TD2 has elapsed from the point in which the second activation control signal EN2 is deactivated.

This indicates that the light source 1 should be turned off after conversion operation of the ADC 50 is completed. In other embodiments, the second interval TD2 may be set to zero.

In FIG. 2B, the start signal START and the end signal END indicate start and end of the conversion operation of the ADC 50, but such signals are not necessarily provided physically.

In FIG. 2B, the start signal START and the end signal END indicate that the conversion operation of the ADC 50 is performed while the first activation control signal EN1 is activated.

Since the period in which the first activation control signal EN1 is deactivated and the second activation control signal EN2 is activated is for the initialization operation, it is preferable not to perform the conversion operation at the ADC 50 during this period.

Accordingly, it can be understood that the offset removing operation is performed while both the first activation control signal EN1 and the second activation control signal EN2 are activated.

In the present embodiment, the first activation control signal EN1 may be intermittently turned on and off. At this time, the second activation control signal EN2 may be repeatedly turned on and off according to the first activation control signal EN1 as shown in FIG. 2B.

The offset detector 120 detects overall offset including offset caused from the light source 1 and offset inherent in the circuit.

In one embodiment, the offset detector 120 adjusts the offset control signal S in a certain range in a standard state in which the level of dust in the medium can be known such as a state without dust and finds the offset control signal S which makes a value output from the DSP 60 corresponds to a value for the standard state. The offset detector 120 stores the offset control signal S in the register 130.

While the offset detector 120 operates, the offset control signal S output from the offset detector 120 controls the offset cancelling circuit 200, and when the operation of the offset detector 120 is completed, the register 130 may provide the offset control signal to control the offset cancelling circuit 200.

The temperature sensing circuit 140 senses temperature.

In one embodiment, the offset detector 120 refers to the temperature and when the temperature changes beyond a predetermined amount, the above-described offset detection operation is performed again and the offset control signal S may be updated.

In an embodiment, instead of performing the offset detection operation again, the offset detector 120 may update the offset control signal S by considering a temperature detection result and an offset change rate according to temperature, which is known or determined previously.

FIG. 3A shows a block diagram of a sensor according to an embodiment of the present disclosure and FIGS. 3B and 3C show waveforms of signals illustrating operations of the sensor according to an embodiment of the present disclosure.

FIG. 3A is a circuit diagram of the sensor 1 according to an embodiment of the present disclosure.

In this embodiment, the conversion circuit 20 is implemented with a differential amplifier circuit using an operational amplifier, and the amplifier 30 is implemented with a differential amplifier circuit using an operational amplifier as a variable gain amplifier.

In this embodiment, the filter 40 includes a high pass filter 41 and a low pass filter 42. The low pass filter 42 may also adjust gain and can be implemented using an operational amplifier.

Since the exemplified circuits for the conversion circuit 20, the amplifier 30, and filter 40 in FIG. 3A may be variously designed by a person skilled in the art using conventional techniques, a detailed description thereof will be omitted.

In this embodiment, the offset cancelling circuit 200 removes offset from the light source 1 or the like by adding an offset signal to an input terminal thereof.

Figure 4:
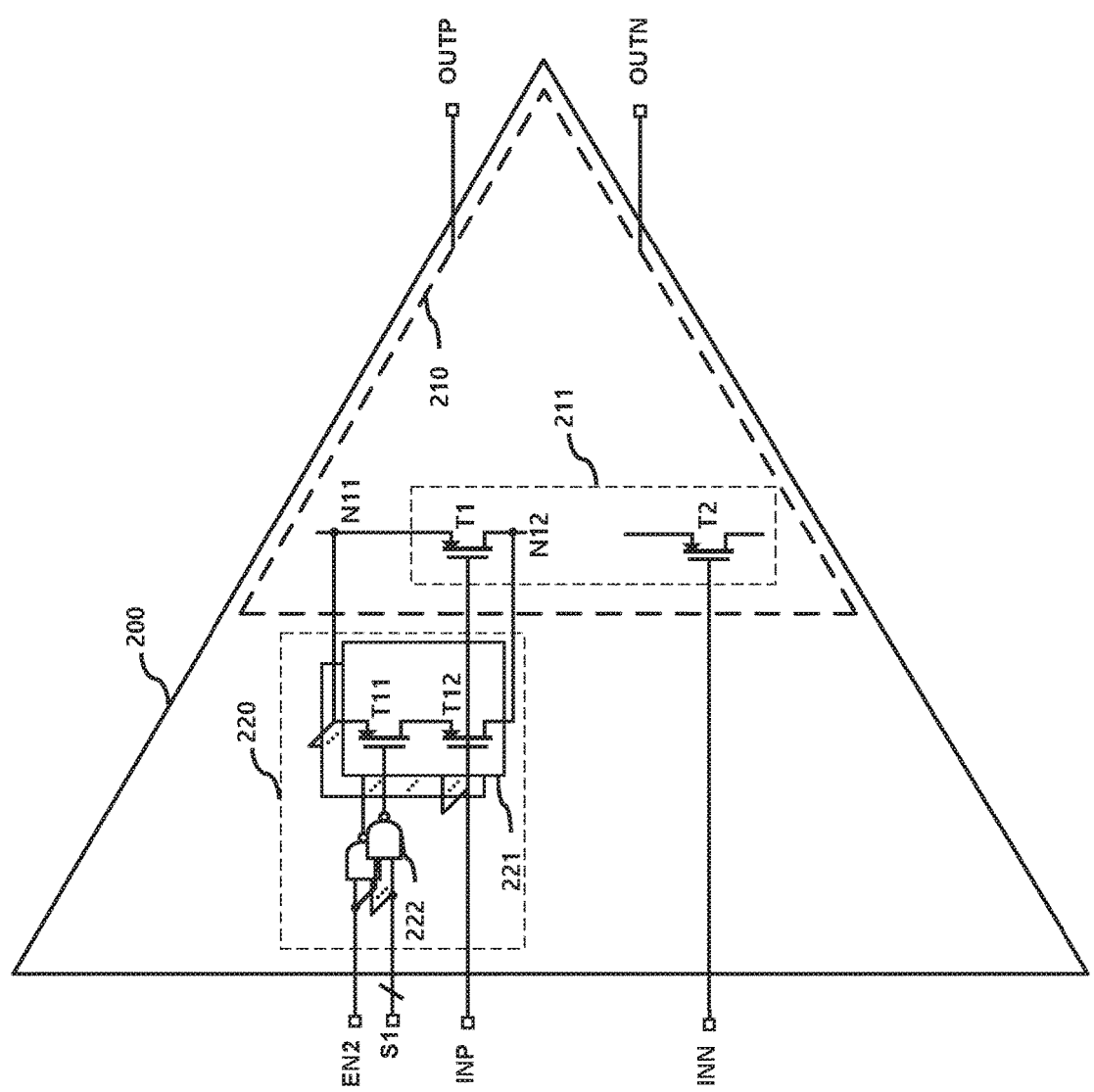
FIGS. 4 and 5 show circuit diagrams of an offset cancelling circuit according to an embodiment of the present disclosure.
Figure 5:
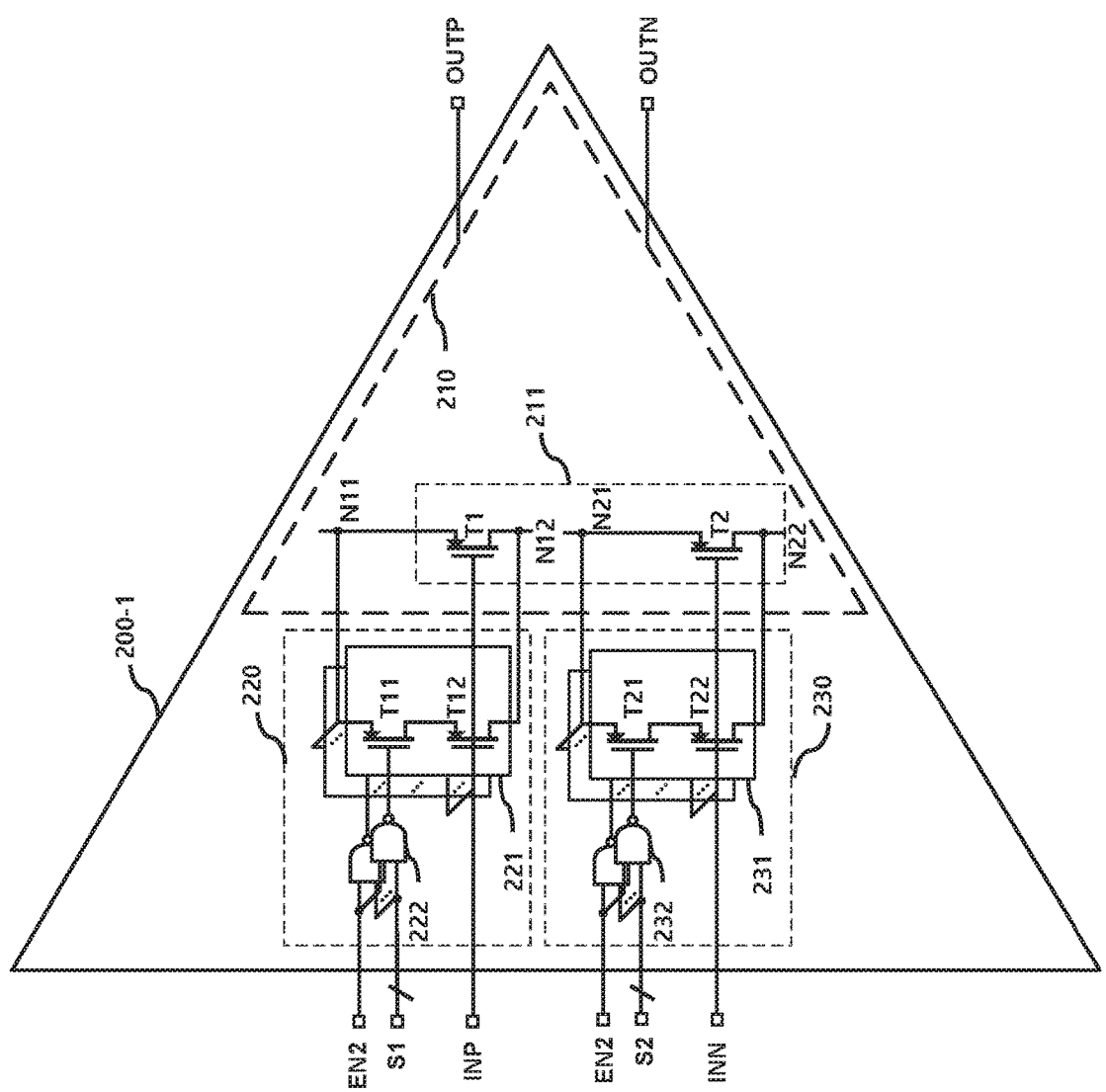

A detailed description thereof will be disclosed with reference to FIGS. 4 and 5.

FIGS. 3B and 3C show waveforms of the output of the conversion circuit 20, the output of the offset cancelling circuit 200, the output of the amplifier 30, the output of the high pass filter 41, and the output of the low pass filter 42. TL denotes an interval in which the light source 1 operates.

In this embodiment, each of the conversion circuit 20, the offset cancelling circuit 200, the amplifier 30, the high pass filter 41, and the low pass filter 42 may perform an amplification operation at a certain level.

In FIG. 3B, (a) corresponds to a case where the offset cancelling operation is not performed as in the prior art, and (b) corresponds to a case where the offset cancelling operation according to the present embodiment is performed.

In (a), the offset component is continuously amplified together with the normal signal, so that the signal may be clipped at the output terminal of the low pass filter 42.

In this case, since the output signal is distorted, dynamic range or amplification ratio must be reduced to prevent distortion.

In the former case, quality of the sensor may be deteriorated, and in the latter case, signal-to-noise ratio (SNR) performance of the sensor may be deteriorated.

In FIG. 3C, (c) corresponds to a case where the offset cancelling operation is not performed as in the prior art like the case in (a), and (d) corresponds to a case that the offset cancelling circuit 200 is activated irrespective of the activation of the light source unlike the case in (b).

Since the offset is not removed in (c), the corresponding waveform is the same as (a).

If the offset is removed even when the light source 1 is turned off as shown in (d), a negative signal may be output from the offset cancelling circuit 200 when the light source 1 is turned off so that the resulting waveform may correspond to a negative shift of the waveform in (c).

When a signal as (d) passes through the high pass filter 41, DC component thereof is removed and the resulting signal may have the same waveform as (c).

This means that a problem similar to (c) may occur when the offset cancelling operation is continuously performed.

In the present embodiment, the operation of the offset cancelling circuit 200 is limited to an interval in which the light source 1 is turned on, and the effect of the offset is completely removed as shown in (b) to increase dynamic range and to improve the SNR performance.

FIG. 4 shows an offset cancelling circuit 200 according to an embodiment of the present disclosure.

The offset cancelling circuit 200 of FIG. 4 includes an operational amplifier circuit having differential input/output.

The offset cancelling circuit 200 includes an operational amplifier circuit 210 and a first offset control circuit 220.

The operational amplifier circuit 210 includes an input circuit 211 including input transistors T1 and T2.

In this embodiment, both the first input transistor T1 and the second input transistor T2 are PMOS transistors. The type of transistor may be changed according to the embodiment.

The operational amplifier circuit 210 amplifies the difference between the differential input signals INP and INN applied to the input circuit 211 and outputs the differential output signals OUTP and OUTN.

The operational amplifier circuit 210 may internally have any circuit structure as long as it includes the input circuit 211 and performs an operational amplification function.

The operational amplifier circuit 210 may have the same circuit structure as, for example, a conventional operational amplifier.

The first input signal INP is applied to the gate of the first input transistor T1 of the input circuit 211 and the second input signal INN is applied to the gate of the second input transistor T2.

The source and drain of the first input transistor T1 are coupled between a first node N11 and a second node N12.

In the present embodiment, the first offset control circuit 220 is coupled in parallel to the first input transistor T1 and is coupled between the first node N11 and the second node N12 according to the first offset control signal S1 and the second activation control signal EN2. It performs substantially the same function as controlling the size of the first input transistor T1 by controlling the amount of current flowing between the first node N11 and the second node N12.

The first offset control circuit 220 includes a plurality of first transistor arrays 221 each including an 11th transistor T11 and a 12th transistor T12 coupled in series.

In this embodiment, both the 11th input transistor T11 and the 12th input transistor T12 are PMOS transistors. The type of transistor may be changed according to the embodiment.

The plurality of first transistor arrays 221 are coupled in parallel between the first node N11 and the second node N12.

The first input signal INP is commonly input to the gate of the 12th transistor T12.

In this embodiment, a signal obtained by performing a NAND operation on a corresponding bit of the first offset control signal S1 and the second activation control signal EN2 is applied to the gate of the eleventh transistor T11 of a corresponding first transistor array 221.

To this end, the first offset control circuit 220 includes a plurality of logic circuits 222 corresponding to the number of the first transistor arrays 221.

In the present embodiment, the logic circuit 222 includes a NAND gate, the type of logic operation and the type of logic circuit may be changed according to the embodiment.

When the second activation control signal EN2 is deactivated, the 11th transistor T11 is turned off, so the first offset control circuit 220 does not affect the first input transistor T1.

When the first activation control signal EN2 is activated, the eleventh transistor T11 is turned on or off according to a corresponding bit of the first offset control signal S1. It performs substantially the same function as adjusting the size of the input transistor T1.

As described above, the offset detector 120 of the control circuit 100 determines the value of the first offset control signal S1 for removing the offset by adjusting the first offset control signal S1.

The embodiment of FIG. 4 discloses an embodiment in which only the size of the first input transistor T1 is adjusted, but in other embodiments, only the size of the second input transistor T2 may be adjusted or sizes of the first input transistor T1 and the second input transistor T2 may be adjusted.

FIG. 5 shows an offset cancelling circuit 200-1 for adjusting the sizes of the first input transistor T1 and the second input transistor T2.

The embodiment of FIG. 5 is substantially the same as the embodiment of FIG. 4 except that the second offset control circuit 230 is further included.

The source and drain of the second input transistor T2 are coupled between a third node N21 and a fourth node N22.

In the present embodiment, the second offset control circuit 230 is coupled in parallel to the second input transistor T2 and couples the third node N21 and the fourth node N22 according to the second offset control signal S2 and the second activation control signal EN2. It performs substantially the same function as controlling the size of the second input transistor T2 by adjusting the current flowing between the third node N21 and the fourth nodes N22.

The second offset control circuit 230 includes a plurality of a second transistor arrays 231 each including a 21st transistor T21 and a 22nd transistor T22 coupled in series.

In this embodiment, both the 21st input transistor T21 and the 22nd input transistor T22 are PMOS transistors. The type of transistor may be changed according to embodiments.

The plurality of second transistor arrays 231 are coupled in parallel between the third node N21 and the fourth node N22.

The second input signal INN is commonly input to the gate of the 22nd transistor T22.

In this embodiment, a signal obtained by performing a NAND operation on a corresponding bit of the second offset control signal S2 and the second activation control signal EN2 is applied to the gate of the 21st transistor T21 of a corresponding second transistor array 231.

To this end, the second offset control circuit 230 includes a plurality of logic circuits 232 corresponding to the number of second transistor arrays 231.

In this embodiment, the logic circuit 232 is a NAND gate, or the type of logic operation and the type of logic circuit may be changed according to embodiments.

When the second activation control signal EN2 is deactivated, the 21st transistor T21 is turned off, so the second offset control circuit 230 does not affect the second input transistor T2.

When the second activation control signal EN2 is activated, the 21st transistor T21 is turned on or off according to a corresponding bit of the second offset control signal S2. It performs substantially the same function as adjusting the size of the input transistor T2.

As described above, the offset detector 120 of the control circuit 100 independently adjusts the first offset control signal S1 and the second offset control signal S2 to remove the offset. The first offset control signal S1 and the second offset control signal S2 may be stored in the register 130.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An amplifier comprising:
    an amplification circuit including an input circuit receiving an input signal and configured to output an output signal by amplifying the input signal; and
    an offset cancelling circuit configured to cancel offset by controlling the input circuit according to activation control signal and offset control signal,
    wherein the offset cancelling circuit cancels the offset according to the offset control signal after the activation control signal is activated,
    wherein the input circuit includes an input transistor and the offset cancelling circuit incudes a plurality of transistor arrays coupled in parallel to the input transistor, and
    wherein each of the plurality of transistor arrays incudes a transistor controlled by the input signal and a transistor controlled by the activation control signal and the offset control signal.

2. The amplifier of claim 1, further comprising a plurality of logic circuits to control the plurality of transistor arrays by performing logic operation on the offset control signal and the activation control signal.

3. An amplifier comprising:
an amplification circuit including an input circuit receiving a first input signal and a second input signal and configured to output differential output signals by amplifying difference between the first input signal and the second input signal; and
a first offset cancelling circuit configured to cancel offset by controlling the input circuit according to activation control signal and a first offset control signal,
wherein the first offset cancelling circuit cancels the offset according to the first offset control signal after the activation control signal is activated,
wherein the input circuit includes a first input transistor receiving the first input signal a second input transistor receiving the second input signal, and the first offset cancelling circuit incudes a plurality of first transistor arrays coupled in parallel to the first input transistor, and
wherein each of the plurality of first transistor arrays includes a 11th transistor controlled by the activation control signal and the first offset control signal and a 12th transistor controlled by the first input signal.

4. The amplifier of claim 3, further comprising a plurality of logic circuits to control the plurality of first transistor arrays by performing logic operation on the first offset control signal and the activation control signal.

5. The amplifier of claim 3, further comprising a second offset cancelling circuit configured to adjust offset by controlling the input circuit according to activation control signal and a second offset control signal,
wherein the second offset control circuit includes a plurality of second transistor arrays coupled in parallel to the second input transistor, and
wherein each of the plurality of second transistor arrays includes a 21st transistor controlled by the activation control signal and the second offset control signal and a 22nd transistor controlled by the second input signal.

6. The amplifier of claim 5, further comprising a plurality of logic circuits to control the plurality of second transistor arrays by performing logic operation on the second offset control signal and the activation control signal.

7. A sensor comprising:
a signal output circuit configured to output a source signal into a medium;
a signal receiving circuit configured to receive the source signal passing through the medium;
an offset cancelling circuit configured to cancel offset from an output of the signal receiving circuit;
an analog-to-digital converter (ADC) configured to convert a signal output from the offset cancelling circuit into a digital signal; and
a control circuit configured to generate an offset control signal by controlling the signal output circuit and the offset cancelling circuit,
wherein the control circuit controls activation of the signal output circuit by a first activation control signal and controls activation of the offset cancelling circuit by a second activation control signal, and
wherein the offset cancelling circuit comprises:
an amplification circuit including an input circuit receiving an input signal and configured to output an output signal by amplifying the input signal; and
an offset cancelling circuit configured to cancel offset by controlling the input circuit according to activation control signal and offset control signal,
wherein the offset cancelling circuit adjusts the offset according to the offset control signal after the activation control signal is activated,
wherein the input circuit includes an input transistor and the offset cancelling circuit incudes a plurality of transistor arrays coupled in parallel to the input transistor, and
wherein each of the plurality of transistor arrays incudes a transistor controlled by the input signal and a transistor controlled by the activation control signal and the offset control signal.

8. The sensor of claim 7,
wherein the signal output circuit includes a light source and a driving circuit controlling the light source, and
wherein the signal receiving circuit incudes an optical receiver and a conversion circuit for converting an output of the optical receiver into a voltage signal.

9. The sensor of claim 7,
wherein the control circuit includes a timing controller generating the first activation control signal and the second activation control signal so that the offset cancelling circuit operates during the signal output circuit operates.

10. The sensor of claim 9,
wherein the timing controller generates the first activation control signal and the second activation control signal so that the offset cancelling circuit is activated before the signal output circuit is activated, and
wherein the ADC performs an analog-to-digital conversion operation when both the signal output circuit and the offset cancelling circuit are activated.

11. The sensor of claim 9,
wherein the timing controller generates the first activation control signal so that the signal output circuit is intermittently activated.

12. The sensor of claim 7,
wherein the control circuit further includes an offset detector configured to determine the offset control signal according to an output of the ADC during the offset control signal is adjusted.

13. The sensor of claim 12,
wherein the control circuit further includes a temperature sensing circuit and the offset detector updates the offset control signal according to temperature sensed by the temperature sensing circuit.

14. The sensor of claim 7,
wherein the control circuit further includes a register for storing the offset control signal.

15. The sensor of claim 7, further comprising an amplifier configured to amplify an output of the offset cancelling circuit or a filter configured to filter an output of the offset cancelling circuit,
wherein an output of the amplifier or the filter is input to the ADC.

16. The sensor of claim 7, further comprising a digital signal processor configured to process an output of the ADC.

17. A sensor comprising:
a signal output circuit configured to output a source signal into a medium;
a signal receiving circuit configured to receive the source signal passing through the medium;
an offset cancelling circuit configured to cancel offset from an output of the signal receiving circuit;
an analog-to-digital converter (ADC) configured to convert a signal output from the offset cancelling circuit into a digital signal; and a control circuit configured to generate an offset control signal by controlling the signal output circuit and the offset cancelling circuit, wherein the control circuit controls activation of the signal output circuit by a first activation control signal and controls activation of the offset cancelling circuit by a second activation control signal, wherein a signal output from the signal receiving circuit is a differential signal, wherein the offset cancelling circuit comprise:

an amplification circuit including an input circuit receiving a first input signal and a second input signal and configured to output differential output signals by amplifying difference between the first input signal and the second input signal; and a first offset cancelling circuit configured to cancel offset by controlling the input circuit according to activation control signal and a first offset control signal, wherein the first offset cancelling circuit cancels the offset according to the first offset control signal after the activation control signal is activated, and the input circuit includes a first input transistor receiving the first input signal a second input transistor receiving the second input signal, and the first offset cancelling circuit incudes a plurality of first transistor arrays coupled in parallel to the first input transistor, wherein each of the plurality of first transistor arrays includes a 11th transistor controlled by the activation control signal and the first offset control signal and a 12th transistor controlled by the first input signal.

18. The sensor of claim 17, further comprising a second offset cancelling circuit configured to cancel offset by controlling the input circuit according to activation control signal and a second offset control signal, wherein the second offset control circuit includes a plurality of second transistor arrays coupled in parallel to the second input transistor, and wherein each of the plurality of second transistor arrays includes a 21st transistor controlled by the activation control signal and the second offset control signal and a 22nd transistor controlled by the second input signal.

* * * * *